United States Patent
Miikkulainen et al.

(10) Patent No.: US 11,634,814 B2
(45) Date of Patent: Apr. 25, 2023

(54) ATOMIC LAYER DEPOSITION APPARATUS

(71) Applicant: BENEQ OY, Espoo (FI)

(72) Inventors: Ville Miikkulainen, Espoo (FI); Hulda Aminoff, Espoo (FI); Pekka Soininen, Espoo (FI); Pekka J. Soininen, Espoo (FI)

(73) Assignee: BENEQ GROUP OY, Espoo (FI)

( * ) Notice: Subject to any disclaimer, the term of this patent is extended or adjusted under 35 U.S.C. 154(b) by 0 days.

(21) Appl. No.: 17/622,291

(22) PCT Filed: Jun. 26, 2020

(86) PCT No.: PCT/FI2020/050466
§ 371 (c)(1),
(2) Date: Dec. 23, 2021

(87) PCT Pub. No.: WO2020/260770
PCT Pub. Date: Dec. 30, 2020

(65) Prior Publication Data
US 2022/0205097 A1   Jun. 30, 2022

(30) Foreign Application Priority Data
Jun. 28, 2019   (FI) .................................... 20195591

(51) Int. Cl.
*C23C 16/40* (2006.01)
*C23C 16/455* (2006.01)
*C23C 16/44* (2006.01)

(52) U.S. Cl.
CPC .... *C23C 16/45544* (2013.01); *C23C 16/4412* (2013.01); *C23C 16/45561* (2013.01)

(58) Field of Classification Search
CPC .......... C23C 16/45544; C23C 16/4412; C23C 16/45561; C23C 16/448; C23C 16/45527;
(Continued)

(56) References Cited

U.S. PATENT DOCUMENTS

2006/0126700 A1 * 6/2006 Wilcox .................... H05B 6/26
    373/151
2008/0063798 A1   3/2008 Kher et al.
(Continued)

FOREIGN PATENT DOCUMENTS

WO    2013064737 A2    5/2013

OTHER PUBLICATIONS

International Search Report issued by the Finnish Patent and Registration Office acting as the International Searching Authority in relation to International Application No. PCT/FI2020/050466 dated Dec. 2, 2020 (4 pages).
(Continued)

*Primary Examiner* — Rudy Zervigon
(74) *Attorney, Agent, or Firm* — Robert P. Michal, Esq.; Carter, DeLuca & Farrell LLP

(57) ABSTRACT

An atomic layer deposition apparatus having a vacuum chamber, a deposition chamber within the vacuum chamber, an inlet channel extending from outside of the vacuum chamber to the deposition chamber such that the inlet channel is connected to the deposition chamber for supplying gases to the deposition chamber, a discharge channel extending from the deposition chamber to outside of the vacuum chamber for discharging gases from the deposition chamber, one or more first precursor supply sources connected to the inlet channel, and one or more second precursor supply sources connected to the inlet channel. The vacuum chamber is arranged between the one or more first precursor supply sources and the one or more second precursor supply sources.

13 Claims, 3 Drawing Sheets

(58) Field of Classification Search
CPC . C23C 16/54; C23C 16/45551; C23C 16/545; H01L 21/6719; H01L 21/67196; H01L 21/67201; H01L 21/67173; H01L 21/67184; H01L 21/6776; H01L 21/67161; H01L 21/67155
USPC .................. 118/719; 156/345.31, 345.32
See application file for complete search history.

(56) References Cited

U.S. PATENT DOCUMENTS

| | | |
|---|---|---|
| 2008/0193643 A1 | 8/2008 | Dip |
| 2010/0136313 A1 | 6/2010 | Shimizu et al. |
| 2010/0183825 A1* | 7/2010 | Becker ............... C23C 16/458 427/569 |
| 2012/0058630 A1* | 3/2012 | Quinn ................ C30B 25/02 427/255.39 |
| 2012/0222751 A1* | 9/2012 | Okabe .............. H01L 21/67017 137/376 |
| 2012/0266819 A1 | 10/2012 | Sanchez et al. |
| 2015/0184297 A1 | 7/2015 | Kim et al. |
| 2017/0067163 A1 | 3/2017 | Papasouliotis et al. |

OTHER PUBLICATIONS

Written Opinion of the International Searching Authority issued by the Finnish Patent and Registration Office acting as the International Searching Authority in relation to International Application No. PCT/FI2020/050466 dated Dec. 2, 2020 (5 pages).

Finnish Search Report issued by the Finnish Patent and Registration Office in relation to Finnish Application No. 20195591 dated Jan. 29, 2020 (1 page).

\* cited by examiner

ATOMIC LAYER DEPOSITION APPARATUS

CROSS-REFERENCE TO RELATED APPLICATIONS

This application is a national phase entry under 35 U.S.C. 371 of PCT International Application No. PCT/FI2020/050466 filed Jun. 26, 2020, which claims priority to Finnish Patent Application No. 20195591, filed Jun. 28, 2019, the disclosure of each of these applications is expressly incorporated herein by reference in their entirety.

FIELD OF THE INVENTION

The present invention relates to an atomic layer deposition apparatus.

BACKGROUND OF THE INVENTION

Atomic layer deposition method utilizes conventionally precursor materials having low vapour pressure. Usually these kinds of materials are solid precursor materials. However, also some liquid precursors may be considered as low vapour pressure materials. During atomic layer deposition method, the precursors are supplied to a deposition chamber of an atomic layer deposition apparatus in gas phase. Thus, the solid or liquid precursor materials are vaporized and dosed in gaseous form into the deposition chamber for subjecting a surface of a substrate to the precursor material. In order to supply these low vapour pressure precursors to the deposition chamber such that dose is large enough and the operating speed or dosing speed is good enough, the precursor materials need to be heated. Thus, these precursor sources or source arrangements are usually called hot sources.

In the prior art precursors are supplied from precursor sources to the deposition chamber through channels that extend from source arrangements that are arranged further away from the deposition chamber. One of the disadvantages of the prior art precursor source arrangements and atomic layer deposition apparatuses is that maintaining an increasing temperature gradient along the supply path of the precursor material is compromised such that the temperature of the precursor material may locally decrease during supplying to the deposition chamber. When the temperature of the precursor material decreases, the gaseous precursor tends to condensate into liquid. Liquid condensate deteriorates the atomic layer deposition process and apparatus.

BRIEF DESCRIPTION OF THE INVENTION

An object of the present invention is to provide an atomic layer deposition apparatus for processing substrates which the apparatus provides efficient thermal conditions for heated precursors to be supplied from precursor sources to a deposition chamber such that temperature gradient is rising to prevent the formation of cold spots and condensation with them.

The objects of the invention are achieved by an atomic layer deposition apparatus which is characterized by what is stated in the independent claim. The preferred embodiments of the invention are disclosed in the dependent claims.

The invention is based on the idea of providing an atomic layer deposition apparatus for processing substrates according to principles of atomic layer deposition having short passages for heated precursors to flow from precursor sources to the deposition chamber. The atomic layer deposition apparatus according to the invention comprises a vacuum chamber, a deposition chamber within the vacuum chamber, an inlet channel extending from outside of the vacuum chamber to the deposition chamber such that the inlet channel is connected to the deposition chamber for supplying gases to the deposition chamber and a discharge channel extending from the deposition chamber to outside of the vacuum chamber for discharging gases from the deposition chamber. The apparatus further comprises one or more first precursor supply sources connected to the inlet channel, and one or more second precursor supply sources connected to the inlet channel. The vacuum chamber is arranged between the one or more first precursor supply sources and the one or more second precursor supply sources. In other words, the vacuum chamber is arranged such that the one or more first precursor supply sources are arranged on first side of the vacuum chamber and the one or more second precursor sources are arranged on the second side of the vacuum chamber which is opposite to the first side of the vacuum chamber. The one or more first precursor sources, the vacuum chamber and the one or more second precursor sources are preferably arranged at the same horizontal level. The first precursor sources and the second precursor sources are liquid or solid precursor sources which are supplied to the deposition chamber inside the vacuum chamber through the inlet channel. The first precursor sources and the second precursor sources are preferably different precursor sources having different process temperatures such that the first precursor sources are high temperature precursor sources and the second precursor sources are low temperature precursor sources.

The apparatus according to the invention further comprises a first side compartment and a second side compartment such that the vacuum chamber is arranged between the first and second side compartments. The one or more first precursor supply sources are arranged inside the first side compartment, and the one or more second precursor supply sources are arranged inside the second side compartment. In other words, the first side compartment, the vacuum chamber and the second side compartment are preferably arranged side by side such that the vacuum chamber is arranged to separate the first and second side compartments from each other and such that the first and second precursor supply channels coming from the first and second precursor sources are arranged to enter the vacuum chamber on opposite sides of the vacuum chamber.

According to the invention the one or more first precursor sources are connected to the inlet channel with one or more first precursor supply channels such that the one or more first precursor supply channels are arranged to extend from the one or more first precursor supply sources to the inlet channel inside the vacuum chamber. Further according to the invention, the one or more second precursor supply sources are connected to the inlet channel with one or more second precursor supply channels such that the one or more second precursor supply channels are arranged to extend from the one or more second precursor supply sources to the inlet channel inside the vacuum chamber. The inlet channel is arranged to extend inside the vacuum chamber such that the connection between the one or more first precursor supply channels and the inlet channel is provided perpendicularly, i.e. the connection between the inlet channel and the first precursor supply channel is perpendicular such that the first precursor supplied through the first precursor supply channel is arranged to enter the inlet channel perpendicularly so that the first precursor will mix with gas coming through the inlet channel. The same applies to the connection between the one or more second precursor supply channels and the inlet channel.

The first and second precursors in the first and second precursor sources are preferably different such that they require different temperature levels. Therefore, the apparatus according to an embodiment of the invention comprises one or more first chambers arranged within the first side compartment. The one or more first chambers comprising the one or more first precursor supply sources inside the one or more first chambers. The one or more first chambers are preferably a heated chamber receiving heating energy outside the chamber or the chamber comprises a heating element for heating the chamber. Alternatively, the first side compartment is a first chamber comprising at least one heater for heating the one or more first precursor supply sources arranged within the first side compartment. The difference between the compartment and the chamber is that the compartment is an outer structure of the apparatus for covering the precursor source inside the compartment and therefore comprises structural elements associated with covering the physical source, such as a source bottle, arranged inside the compartment, but the chamber comprises features and elements associated with pressurization or heating the chamber required by the liquid or solid properties of the precursor substance provided within the source.

According to an embodiment of the invention the first chamber is insulated from the vacuum chamber which means that the first compartment is arranged to form the first chamber. Alternatively, the first chamber is insulated from the first side compartment which means that the first chamber is provided inside the first side compartment and is a separate chamber inside the first side compartment.

According to an embodiment of the invention the apparatus comprises a first lead-through connection between the first side compartment and the vacuum chamber such that the one or more first precursor supply channels are extending from the first side compartment to the vacuum chamber through the first lead-through connection. The apparatus further comprises a second lead-through connection between the second side compartment and the vacuum chamber such that the one or more second precursor supply channels are extending from the second side compartment to the vacuum chamber through the second lead-through connection. The first lead-through connection and the second lead-through connection are provided on opposite sides of the vacuum chamber. The vacuum chamber comprises a first end wall and a second end wall opposite to the first end wall and an opening to the vacuum chamber at the first end wall. Further a chamber axis is extending between the first and second end walls such that the vacuum chamber can be divided by an imaginary vertical partition wall through the chamber axis into two parts. The first lead-through connection is provided at a wall of the vacuum chamber in the first part of the vacuum chamber and the second lead-through connection is provided at a wall of the vacuum chamber in the second part of the vacuum chamber, i.e. the first lead-through connection is provided on opposite side of the vacuum chamber than the second lead-through connection which the vacuum chamber is divided into two parts with a plane extending vertically through the chamber axis. The vacuum chamber can also be divided into two parts, an upper part and a lower part, with a plane extending horizontally through the chamber axis. The apparatus further comprises a third lead-through connection at a bottom wall of the vacuum chamber. The bottom wall of the vacuum chamber is provided at the lower part of the vacuum chamber. The inlet channel and the discharge channel are arranged to extend downward from the deposition chamber. The inlet channel is extending from the deposition chamber inside the vacuum chamber through the third lead-through connection to outside of the vacuum chamber.

According to the invention the first and second side compartments are arranged on opposite sides of the vacuum chamber in a direction transverse to the chamber axis, more particularly in a direction horizontally transverse to the chamber axis.

According to an embodiment of the invention the inlet channel is arranged to extend inside the vacuum chamber in a transverse direction relative to the chamber axis. Alternatively or in addition, the inlet channel is arranged to extend inside the vacuum chamber in a perpendicular direction relative to the chamber axis.

According to an embodiment of the invention the inlet channel is connected to the deposition chamber inside the vacuum chamber such that a distance from a connection of the inlet channel and the deposition chamber to the second side compartment is smaller than a distance from the connection of the inlet channel and the deposition chamber to the first side compartment. In other words, the inlet channel is preferably arranged to extend inside the vacuum chamber from the bottom of the vacuum chamber to the deposition chamber on that side of the vacuum chamber comprising the second lead-through connection to the second side compartment. In this embodiment, a distance that the first precursor supply channel is arranged to extend from the first side compartment through the lead-through connection to the inlet channel is greater than the distance of the second precursor supply channel extending from the second side compartment to the inlet channel. This is particularly preferable in embodiments in which the first precursor of the first precursor source should maintain its high temperature from the first precursor source all the way to the inlet channel. The vacuum chamber is most preferably a heated vacuum chamber comprising one or more heaters inside the vacuum chamber.

In an embodiment of the invention the vacuum chamber comprises a first end wall having an opening to the vacuum chamber and a second end wall opposite to the first end wall and the inlet channel is arranged in the vacuum chamber such that a connection of inlet channel and the deposition chamber is closer to the second end wall than to the first end wall.

In an embodiment of the invention the apparatus further comprises a lower compartment connected to the vacuum chamber such that the vacuum chamber is arranged above the lower compartment and the inlet channel is arranged to extend from the lower compartment to the deposition chamber arranged inside the vacuum chamber. The third lead-through connection is arranged between the lower compartment and the vacuum chamber to provide a passage for the inlet channel to extend from the lower compartment to the vacuum chamber. The first and the second side compartments are also arranged above the lower compartment.

The first lead-through connection from the first side compartment to the vacuum chamber and the second lead-through connection from the second side compartment to the vacuum chamber are preferably arranged such that the precursor supply channels extending through the lead-throughs are transverse relative to the chamber axis when the precursor supply channels enter the vacuum chamber on opposite sides of the vacuum chamber divided into two parts by an imaginary vertical plane passing through the chamber axis. The third lead-through connection from the lower compartment to the vacuum chamber is arranged such that the inlet channel extending through the third lead-through is transverse to the chamber axis when entering to the vacuum chamber. In a preferable embodiment of the invention the inlet channel is arranged to extend in a vertical direction inside the vacuum chamber and such that the first and second precursor supply channels that are connected to the inlet channel extend transversely relative to the inlet channel. In a preferred embodiment of the invention the first and second precursor supply channels are connected to the inlet channel perpendicularly. The third lead-through connection is arranged between the lower compartment and the vacuum chamber such that the inlet channel is arranged to extend vertically or substantially vertically through the third lead-through connection whereas the first lead-through connection is arranged between the first side compartment and the vacuum chamber such that the first precursor supply channel is arranged to extend through the first lead-through connection in a transverse direction to the inlet channel and the second lead-through connection is arranged between the second side compartment and the vacuum chamber such that the second precursor supply channel is arranged to extend through the second lead-through connection in a transverse direction to the inlet channel on the opposite side of the vacuum chamber than the first precursor supply channel.

According to the invention the apparatus comprises a gas source arranged within the lower compartment. Alternatively or in addition, the apparatus comprises a suction device arranged within the lower compartment.

According to the invention the vacuum chamber is arranged between the first precursor source and the second precursor source, more specifically between the first side compartment comprising the first precursor source and the second side compartment comprising the second precursor source. The term "between" in this connection means that the vacuum chamber is provided next to the first side compartment and next to the second side compartment such that first side compartment is on the opposite side of the vacuum chamber than the second side compartment. The vacuum chamber is connected to the side compartments such that a passage from the side compartments to the vacuum chamber are arranged with the lead-throughs.

An advantage of the invention is that the precursor supply channels are arranged such that distance from the precursor source to the inlet channel connected to the deposition chamber is minimized in order to provide optimal precursor flows from the precursor source to the inlet channel. Another advantage of the invention is that the minimized distance from the precursor sources to the inlet channel and rising temperature gradient due to vacuum chamber heating prevent effectively the formation of cold spots, especially when the precursor is supplied from a heated chamber surrounding the precursor source in the side compartment.

BRIEF DESCRIPTION OF THE DRAWINGS

The invention is described in detail by means of specific embodiments with reference to the enclosed figures, in which.

DETAILED DESCRIPTION OF THE INVENTION

Figure 1:
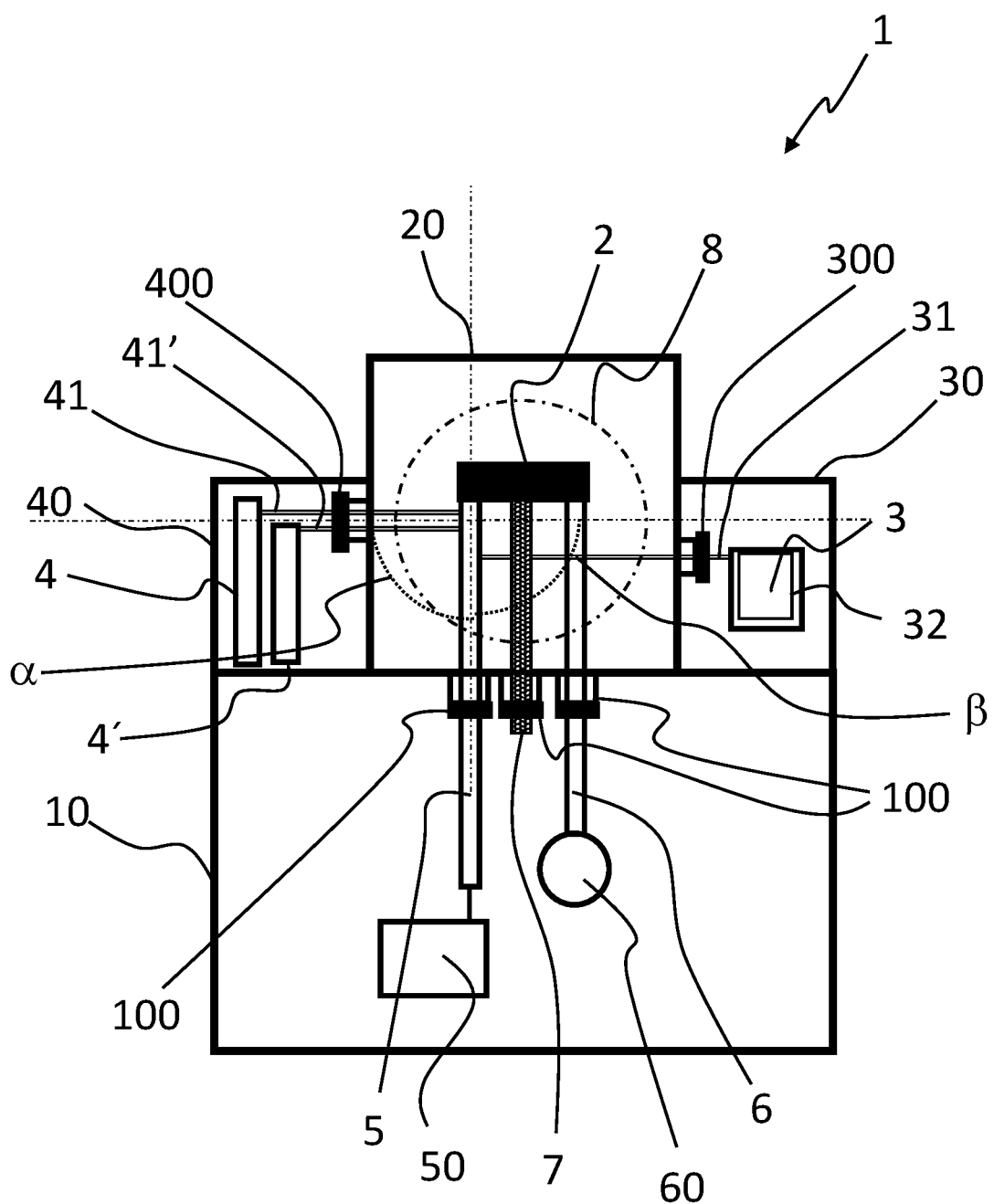
FIG. 1 shows an embodiment of the apparatus according to the invention.

FIG. 1 shows an embodiment of the apparatus according to the invention in which the vacuum chamber 20 is arranged between the first and second side compartment 30, 40 and above the lower compartment 10. As can be seen from FIG. 1 the vacuum chamber 20 and the first side compartment 30 are connected together such that there is a first lead-through connection 300 from the first side compartment 30 to the vacuum chamber 20. Further the vacuum chamber 20 and the second side compartment 40 on opposite side of the vacuum chamber 20 than the first side compartment 30 are connected together such that there is a second lead-through connection 400 from the second side compartment 40 to the vacuum chamber 20. The second lead-through connection 400 is on opposite side of the vacuum chamber 20 than the first lead-through connection 300. Further the vacuum chamber 20 and the lower compartment 10 are connected together such that there is at least one third lead-through connection 100 from the lower compartment 10 to the vacuum chamber 20. FIG. 1 shows that the connection between the lower compartment 10 and the vacuum chamber 20 comprises three third lead-through connections 100 from the lower compartment 10 to the vacuum chamber 20. Further as can be seen from FIG. 1 the third lead-through connection 100 is substantially vertically oriented and the first and second lead-through connections 300, 400 are substantially horizontally oriented such that the second lead-through connection 400 is at an angle of 60-120° (most preferably at an angle of 90° which is shown in FIG. 1) to the third lead-through connection 100 and the third lead-through connection 100 is at an angle of 60-120° (most preferably at an angle of 90° which is shown in FIG. 1) to the first lead-through connection 300. In FIG. 1 the angle α between the second lead-through connection 400 and the third lead-through connection 100 is 90° and the angle β between the third lead-through connection 100 and the first lead-through connection 300 is also 90° such that the angle between the first lead-through connection 300 and the second lead-through connection 400 is 180°.

FIG. 1 also shows that the first side compartment 30 comprises the first precursor source 3 which can be arranged in a first chamber 32 or alternatively the first side compartment 30 is arranged to form the first chamber 32. The first chamber 32 is pressurized chamber and/or heated chamber. Although figures show that the first side compartment 30 encloses the first precursor source which requires higher temperatures than the second precursor source 4 the precursor sources 3, 4 may also switch places such that the first side compartment encloses the second precursor source and the second side compartment encloses the first precursor source. The first precursor source 3 is connected through a first precursor supply channel 31 to the inlet channel 5 which is extending from the lower compartment 10 to the vacuum chamber 20 and further to the deposition chamber 2. The first precursor supply channel 31 is arranged to extend from the first precursor source 3 through the lead-through connection to the vacuum chamber 20 and further to the inlet channel 5 such that the first precursor supply channel is connected to the inlet channel 5 such that a flow communication is formed between the first precursor supply channel and the inlet channel 5.

FIG. 1 further shows that the second side compartment 4 comprises the second precursor source 4, 4' and in the embodiment shown in FIG. 1 there are two second precursor sources 4, 4' enclosed inside the second side compartment 4. The second precursor sources 4, 4' are connected to the inlet channel 5 through the second precursor supply channels 41, 41'. The second precursor supply channels 41, 41' extend from the second precursor sources 4, 4' through the second lead-through connection 400 to the vacuum chamber 20 and further to the inlet channel 5 such that the second precursor supply channels 41, 41' are connected to the inlet channel 5.

Although figures do not specifically show the vacuum chamber 20 is preferably heated such that the vacuum chamber 20 comprises at least one heater connected to an interior surface of the vacuum chamber.

The vacuum chamber 20 comprises a deposition chamber 2 provided inside the vacuum chamber 20. The deposition chamber 2 comprises a space within the deposition chamber into which a substrate to be coated is placed. The inlet channel 5 is connected to the deposition chamber 5 for supplying gas flows into the deposition chamber 2 during processing of the substrate. The inlet channel 5 supplies the first precursor supplied from the first precursor source through the first precursor supply channel 31 to the deposition chamber 2 and also the second precursor supplied from the second precursor source through the second precursor supply channel 41 to the deposition chamber 2 as well as other gases such as purge gases from the lower compartment 10 comprising a gas source 50 arranged within the lower compartment 10. The inlet channel 5 is preferably arranged to extend from the gas source 50 through the third lead-through connection 100 to the vacuum chamber 20 and further to the deposition chamber 2 such that the inlet channel 5 and the deposition chamber 2 are connected together.

The lower compartment 10 further comprises a suction device 60 or other equipment relating to discharging gases from the deposition chamber 2 through the discharge channel 6 connected to the deposition chamber 2 and extending through the third lead-through connection 100 from the vacuum chamber 2 to the lower compartment 10. The lower compartment 10 also comprises means for moving the deposition chamber 2 such as mechanical construction for opening and closing the deposition chamber 2 which is preferably arranged such that a bottom of the deposition chamber 2 is arranged to be moved downwards in the vacuum chamber 2 for opening the deposition chamber 2 and further to be moved upwards for closing the deposition chamber 2. FIG. 1 also shows that a door 8 for opening and closing the vacuum chamber 2 is provided on a front side of the vacuum chamber 2 such that the first side compartment 30 is arranged adjacent to the door 8 and the second side compartment 40 is arranged adjacent to the door 8 on the opposite side of the door 8 than the first side compartment 30.

Figure 2:
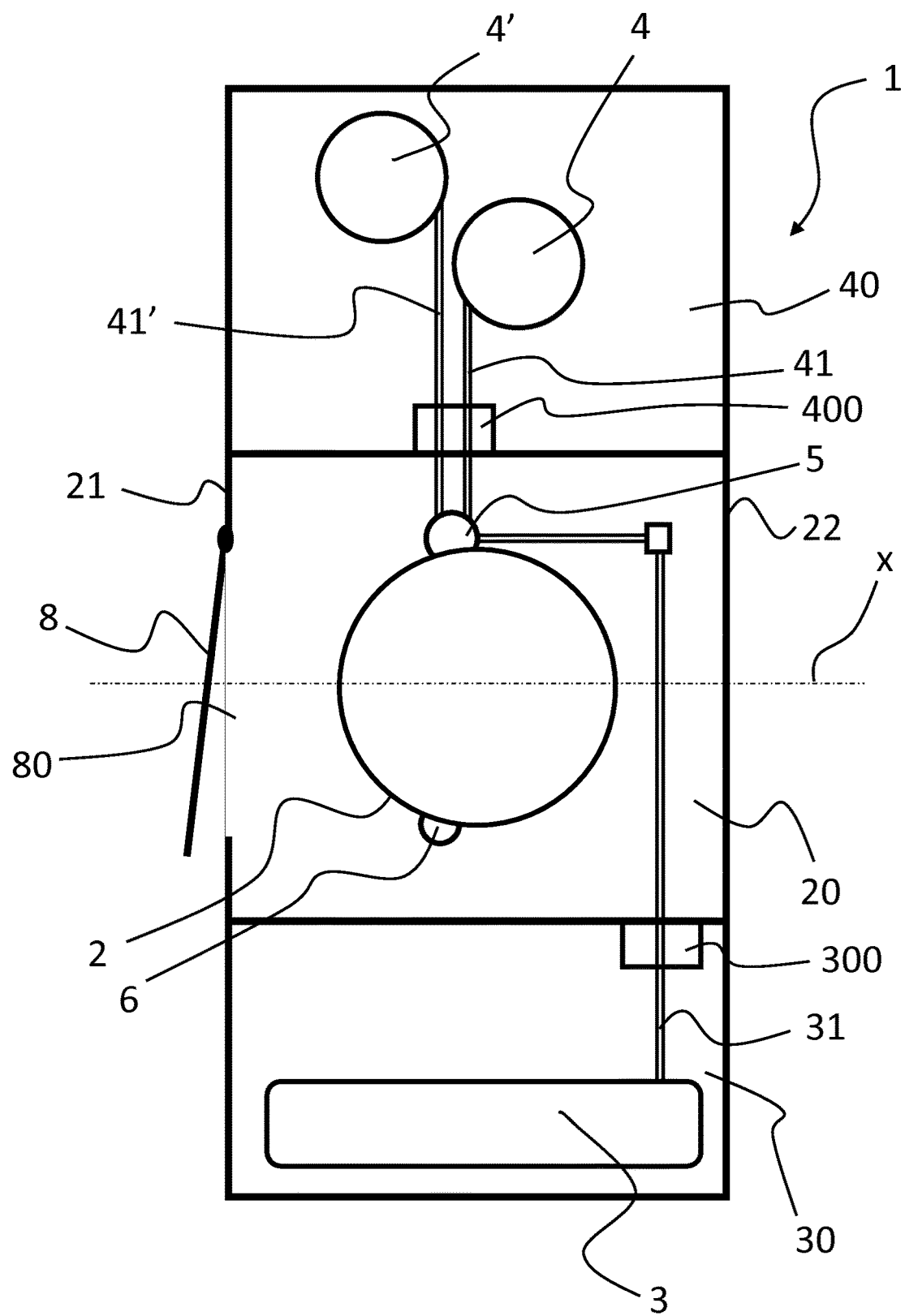
FIG. 2 shows the embodiment of the apparatus shown in FIG. 1 as seen from above.

FIG. 2 shows the embodiment of the apparatus 1 shown in FIG. 1 as seen from above. The chamber axis x extends between the first end wall 21 and the second end wall 22 of the vacuum chamber 20. The first end wall 21 is in this embodiment of the invention a front wall of the vacuum chamber 20 comprising an opening 80 to the vacuum chamber 20 which the opening 80 can be closed with a door 8 for forming a closed vacuum chamber 20. As seen from above the vacuum chamber 20 the chamber axis x divides the vacuum chamber 20 into two parts; a first part having the first lead-through connection 300 to the first side chamber 30 and a second part having the second lead-through connection 400 to the second side chamber 40. The first lead-through connection 300 provides a first passage for the first precursor supply channel 31 extending from the first precursor source 3 inside the first side compartment 30 to the inlet channel 5 inside the vacuum chamber 20. The second lead-through connection 400 provides a second passage for the second precursor supply channel 41, 41' extending from the second precursor source 4, 4' inside the second side compartment 40 to the inlet channel 5 inside the vacuum chamber 20.

The vacuum chamber 20 comprises a deposition chamber 2 provided inside the vacuum chamber 20. The inlet channel 5 extending from the lower compartment substantially vertically to the vacuum chamber 20 is connected to the deposition chamber such that the connections from the first and second precursor supply channel 31, 41, 41' to the inlet channel 5 are provided at the inlet channel 5 in an area between the third lead-through connection 100 and the connection to the deposition chamber 2. The discharge channel 6 connected to the deposition chamber 2 for discharging gases from the deposition chamber 2 is preferably arranged to extend vertically from the deposition chamber 2 to the lower compartment 10. In the embodiment shown in FIG. 2 the inlet channel 5 is arranged in the vacuum chamber 2 closer to the second side compartment 40 than the first side compartment 30. However, the inlet channel 5 may alternatively be arranged in the vacuum chamber 2 closer to the first side compartment 30 than the second side compartment 40.

Figure 3:
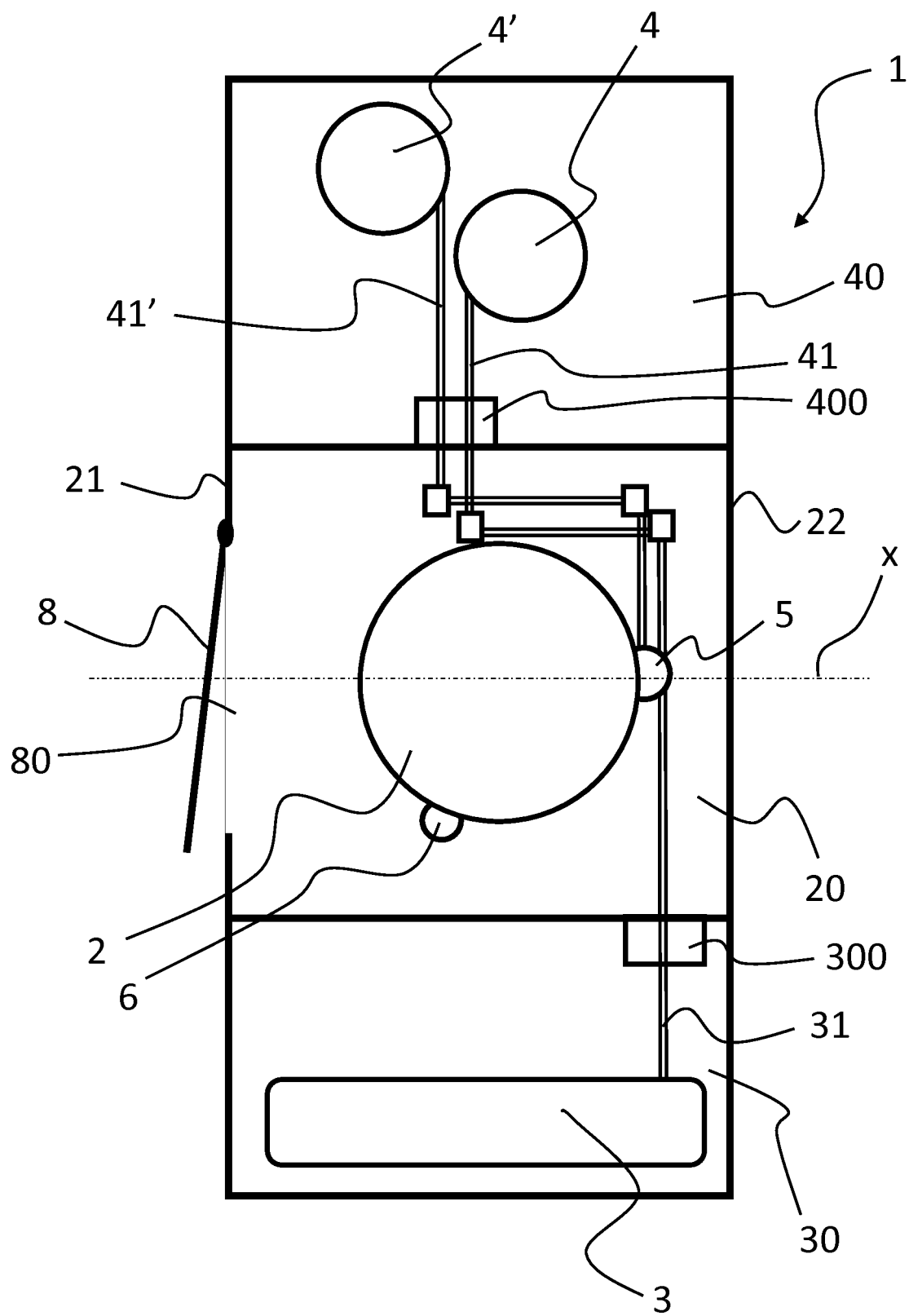
FIG. 3 shows another embodiment of the apparatus according to the invention.

FIG. 3 shows another embodiment of the apparatus according to the invention in which the inlet channel 5 is arranged such that the distance from the first side compartment 30 and the distance from the second side compartment 40 to the inlet channel 5 is substantially the same. In this example, the inlet channel 5 is arranged closed to the second end wall 22 of the vacuum chamber than the first end wall 21. Otherwise all the other features in this exemplary figure all similar to the FIG. 2. However, this example shows that although the first precursor supply channel 31 is minimized the second precursor supply channels 41, 41' are arranged to extend through two angles from the second precursor source 4, 4' to the inlet channel 5.

The invention has been described above with reference to the examples shown in the figures. However, the invention is in no way restricted to the above examples but may vary within the scope of the claims.

The invention claimed is:

1. An atomic layer deposition apparatus for processing substrates according to principles of atomic layer deposition, the apparatus comprising:
   a vacuum chamber,
   a deposition chamber within the vacuum chamber,
   an inlet channel extending from the vacuum chamber to the deposition chamber such that the inlet channel is connected to the deposition chamber for supplying gases to the deposition chamber,
   a discharge channel extending from the deposition chamber to outside of the vacuum chamber for discharging gases from the deposition chamber,
   one or more first precursor supply sources connected to the inlet channel, and
   one or more second precursor supply sources connected to the inlet channel, the vacuum chamber is arranged between the one or more first precursor supply sources and the one or more second precursor supply sources,
   a first side compartment and a second side compartment such that the vacuum chamber is arranged between the first and second side compartments, the one or more first precursor supply sources are arranged inside the first side compartment, and the one or more second precursor supply sources are arranged inside the second side compartment, and
   a lower compartment connected to the vacuum chamber such that the vacuum chamber is arranged above the lower compartment and the inlet channel is arranged to extend from the lower compartment to the deposition chamber arranged inside the vacuum chamber.

2. The apparatus according to claim 1, wherein the one or more first precursor supply sources are connected to the inlet channel with one or more first precursor supply channels such that the one or more first precursor supply channels are arranged to extend from the one or more first precursor supply sources to the inlet channel inside the vacuum chamber.

3. The apparatus according to claim 1, wherein the one or more second precursor supply sources are connected to the inlet channel with one or more second precursor supply channels such that the one or more second precursor supply channels are arranged to extend from the one or more second precursor supply sources to the inlet channel inside the vacuum chamber.

4. The apparatus according to claim 1, wherein the apparatus further comprises:
one or more first chambers arranged within the first side compartment, said one or more first chambers comprising the one or more first precursor supply sources inside the one or more first chambers; or
the first side compartment is a first chamber comprising at least one heater for heating the one or more first precursor supply sources arranged within the first side compartment.

5. The apparatus according to claim 4, wherein the first chamber is insulated from the vacuum chamber; or
the first chamber is insulated from the first side compartment.

6. The apparatus according to claim 1, further comprising a first lead-through connection between the first side compartment and the vacuum chamber such that the one or more first precursor supply channels are extending from the first side compartment to the vacuum chamber through the first lead-through connection, and a second lead-through connection between the second side compartment and the vacuum chamber such that the one or more second precursor supply channels are extending from the second side compartment to the vacuum chamber through the second lead-through connection.

7. The apparatus according to claim 1, wherein the inlet channel and the discharge channel are arranged to extend downward from the deposition chamber.

8. The apparatus according to claim 1, wherein the vacuum chamber comprises:
a first end wall,
a second end wall opposite to the first end wall,
a chamber axis (x) extending between the first and second end walls, and
an opening to the vacuum chamber arranged at the first end wall,
the first and second side compartments are arranged on opposite sides of the vacuum chamber in a direction transverse to the chamber axis (x).

9. The apparatus according to claim 8, wherein:
the inlet channel is arranged to extend inside the vacuum chamber in a transverse direction relative to the chamber axis (x); or
the inlet channel is arranged to extend inside the vacuum chamber in a perpendicular direction relative to the chamber axis (x).

10. The apparatus according to claim 1, wherein:
the inlet channel is connected to the deposition chamber inside the vacuum chamber such that a distance (d1) from a connection of inlet channel and the deposition chamber to the second side compartment is smaller than a distance (d2) from the connection of inlet channel and the deposition chamber to the first side compartment.

11. The apparatus according to claim 1, wherein:
the vacuum chamber comprises a first end wall having an opening to the vacuum chamber and a second end wall opposite to the first end wall, the inlet channel is arranged in the vacuum chamber such that a connection of inlet channel and the deposition chamber is closer to the second end wall than to the first end wall.

12. The apparatus according to claim 2, wherein the first and the second side compartments are arranged above the lower compartment.

13. The apparatus according to claim 1, further comprising:
a gas source arranged within the lower compartment; or
a suction device arranged within the lower compartment; or
a gas source and a suction device arranged within the lower compartment.

* * * * *